United States Patent
Nojo et al.

(10) Patent No.: US 6,419,557 B2
(45) Date of Patent: Jul. 16, 2002

(54) POLISHING METHOD AND POLISHER USED IN THE METHOD

(75) Inventors: Haruki Nojo, Kanagawa-ken; Rempei Nakata, Kamakura; Masako Kodera, Yokohama; Nobuo Hayasaka, Yokosuka, all of (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/834,730

(22) Filed: Apr. 16, 2001

Related U.S. Application Data

(63) Continuation of application No. 08/763,342, filed on Dec. 11, 1996, now Pat. No. 6,224,464, and a continuation of application No. 08/499,583, filed on Jul. 7, 1995, now abandoned.

(30) Foreign Application Priority Data

Jul. 8, 1994 (JP) .............................. 6-157385

(51) Int. Cl.$^7$ .............................. B24B 1/00
(52) U.S. Cl. .......................... 451/41; 451/60
(58) Field of Search .............................. 451/10, 41, 36, 451/60, 28; 216/88, 89; 488/692, 693; 156/636; 437/288, 8, 225; 252/29.2

(56) References Cited

U.S. PATENT DOCUMENTS

| | | |
|---|---|---|
| 3,979,239 A | 9/1976 | Walsh |
| 4,759,917 A | 7/1988 | Coleman et al. |
| 4,959,113 A | 9/1990 | Roberts |
| 5,036,015 A | 7/1991 | Sandhu et al. |
| 5,104,828 A | 4/1992 | Morimoto et al. |
| 5,222,329 A | 6/1993 | Yu |
| 5,225,034 A | 7/1993 | Yu et al. |
| 5,264,010 A | 11/1993 | Brancaleoni et al. |
| 5,272,117 A | 12/1993 | Roth et al. |
| 5,302,233 A | 4/1994 | Kim et al. |
| 5,320,706 A | 6/1994 | Blackwell |
| 5,354,490 A | 10/1994 | Yu et al. |
| 5,421,769 A | 6/1995 | Schultz et al. |
| 5,554,996 A | 9/1996 | Kodera et al. |
| 5,693,239 A | 12/1997 | Wang et al. |
| 5,783,489 A | 7/1998 | Kaufman et al. |
| 6,022,400 A * | 2/2000 | Izumi et al. .................. 106/3 |
| 6,224,464 B1 * | 5/2001 | Nojo et al. .................. 451/41 |

FOREIGN PATENT DOCUMENTS

| | | |
|---|---|---|
| JP | 4-135167 | 5/1992 |
| JP | 4-291724 | 10/1992 |
| JP | 7-221055 | 8/1995 |

\* cited by examiner

Primary Examiner—Derris H. Banks
(74) Attorney, Agent, or Firm—Oblon, Spivak, McClelland, Maier & Neustadt, P.C.

(57) ABSTRACT

A polishing method including applying a polishing agent containing polishing grains and a surfactant onto an oxide film, which is formed on a substrate having a depressed portion and a protruding portion, wherein the surfactant is an organic compound including at least one hydrophilic group selected from the group consisting of COOH, $COOM_1$, wherein $M_1$ represents an atom or a functional group which can form a salt when substituted for a hydrogen atom of a carboxyl group, $SO_3H$ and $SO_3M_2$, wherein $M_2$ represents an atom or a functional group which can form a salt when substituted for a hydrogen atom of a sulfo group; and polishing the film until the film is flattened without the occurrence of dishing.

3 Claims, 8 Drawing Sheets

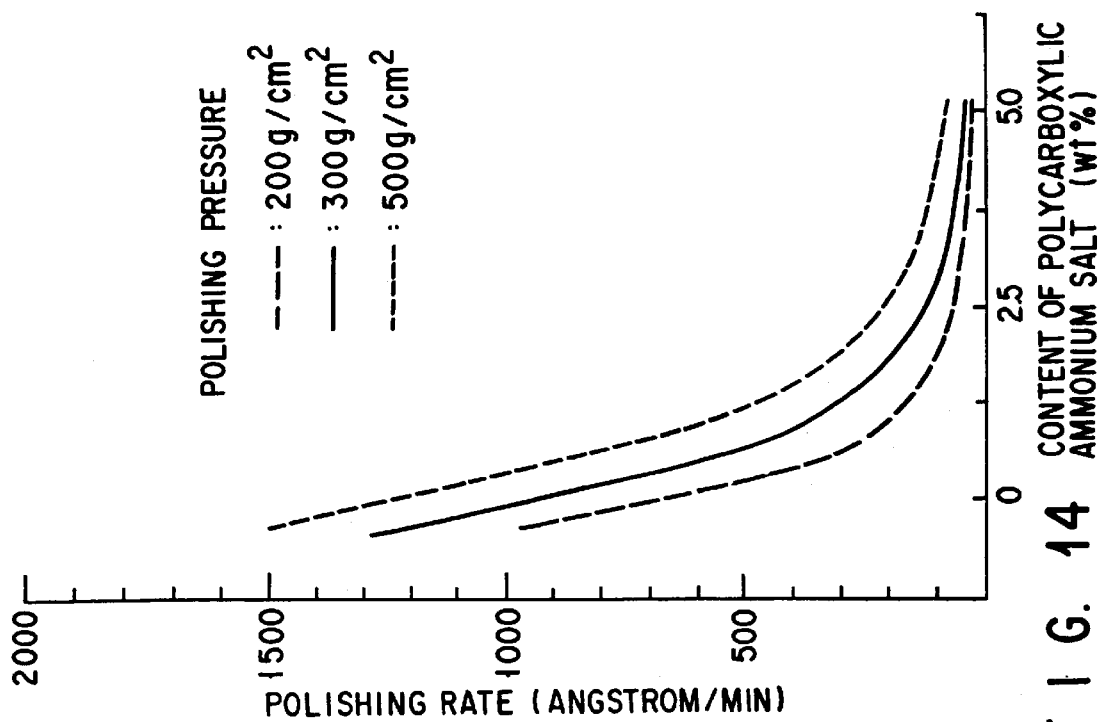
F I G. 14
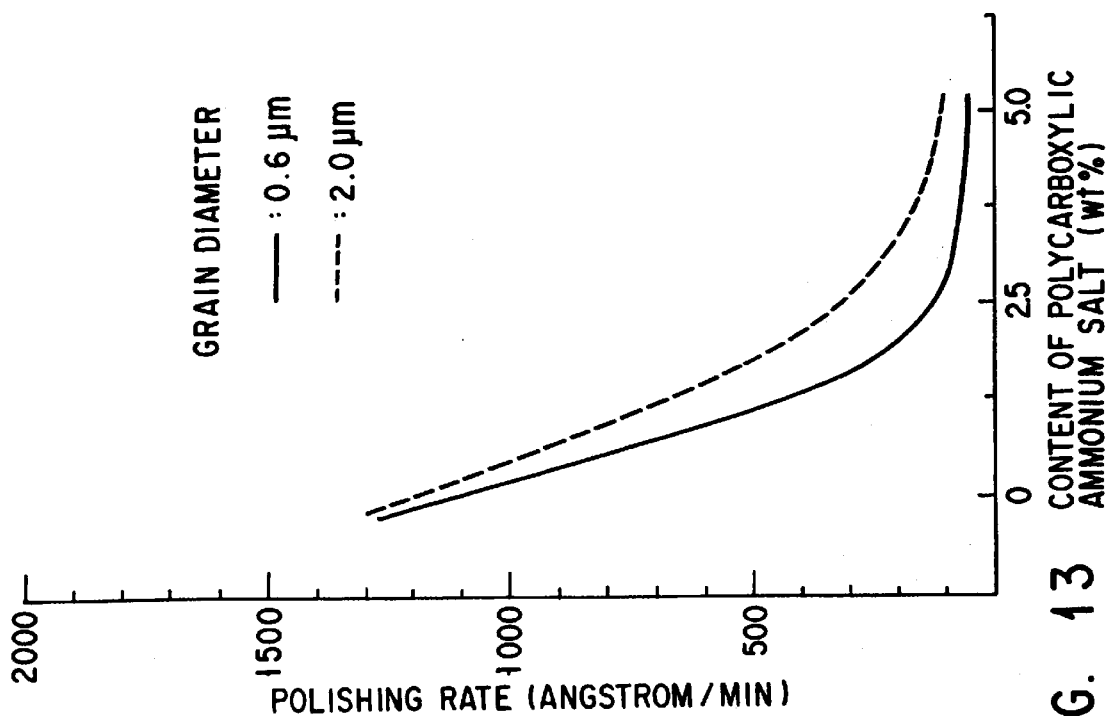
F I G. 13

POLISHING METHOD AND POLISHER
USED IN THE METHOD

This application is a Continuation of Ser. No. 08/763,342 filed Dec. 11, 1996 now U.S. Pat. No. 6,224,464; and a Continuation of Ser. No 08/499,583 filed Jul. 7, 1995 now abandoned.

BACKGROUND OF THE INVENTION

1. Field of the Invention

The present invention relates to a polishing method and a polishing agent used in a semiconductor element manufacturing method, more specifically to a polishing method and a polishing agent used in a step for smoothing the surface of a substrate, especially, smoothing an interlayer insulation film, a step of forming a buried metal wiring portion, a step of forming a buried element separation film, or a step of forming a buried capacitor, or the like.

2. Description of the Related Art

With regard to current ultra-super-large-scale integrated circuits, there is a trend towards reducing the sizes of a transistor and other semiconductor elements and increasing the mounting density. Accordingly, various micro processing techniques are being studied and developed, and the design rule is already set to an order of a sub-half micron.

One of the techniques being developed in order to satisfy the strict requirement of the micro processing is a CMP (chemical mechanical polishing) technique. This technique is essential to the manufacturing process of a semiconductor, in particular, when smoothing an interlayer insulation film, forming a plug, forming a buried metal wiring portion, separation of a buried element, forming a buried capacitor and the like.

FIGS. 1A to 1E are cross sections of an interlayer insulation film, illustrating a step of smoothing the film by use of a CMP technique. First, as shown in FIG. 1A, a silicon oxide film 2 is formed on a silicon substrate 1 a ratio of whose protruding portions occupies 50% of the entire surface, and a first Al wiring portion 3 having a width of 0.3 $\mu$m and a height of 0.4 $\mu$m is formed on the silicon oxide film 2 by a general lithography method and a general etching method. Next, as shown in FIG. 1B, a silicon oxide film 4 having a thickness of 1.3 $\mu$m is formed by a plasma CVD method, and then an abrasion process is carried out so as to smooth the silicon oxide film 4. Various changes in cross-sectional shape of the film are illustrated in FIGS. 1C to FIG. 1E. FIG. 1C shows a cross sectional shape of the film in the case where the abrasion process is completed at an ideal position, whereas FIGS. 1A and 1E each show a cross sectional shape in the case where the abrasion process is excessively carried out.

With the conventional abrasion technique, the abrasion rate changes along with an elapse of time, and therefore it is very difficult to stop the processing at an ideal position as shown in FIG. 1C. Further, in the case where there is a wide space between Al wiring portions, that is, when the silicon oxide film 4 is wide, the center portion of the silicon oxide film has priority to other portions in abrasion, thus causing a so-called dishing.

In the case where the abrasion is excessively carried out as shown in FIG. 1D, the pressure resistance between a second Al wiring portion (not shown) formed on the silicon oxide film 4 and the first Al wiring portion 3 is deteriorated. Further, the abrasion is excessively carried out as shown in FIG. 1E, the first Al wiring portion 3 is in some cases disconnected.

In order to solve the above-described drawbacks, it has been proposed a technique in which an anti-abrasion film 5 made of a material such as $Si_3N_4$, having an abrasion rate lower than that of a to-be-polished member (in this case, silicon oxide film) is formed on the wide silicon oxide film 4 as shown in FIG. 2 (Jap. Pat. Appln. KOKAI Publication No. 5-315308). However, this technique entails a problem in which the selection rate (the abrasion rate of the $Si_3N_4$ film/the abrasion rate of the silicon oxide film) cannot be set high, thus increasing the number of steps of forming, removing and the like of the anti-abrasion film 5.

SUMMARY OF THE INVENTION

The present invention has been proposed in consideration of the above problems, and the object thereof is to provide an abrasion method of polishing a desired protruded portion at high efficiency without causing dishing.

According to the first aspect of the present invention, there is provided a polishing method comprising the steps of: forming a film to be polished, having a depressed portion and a protruding portion on a surface of a substrate; and polishing the film to be polished by relatively moving the substrate and a polishing table, while pressing the substrate having the film to be polished, onto a polishing cloth of the polishing table and supplying a polishing solution containing polishing grains, between the film to be polished and the polishing cloth; wherein an average distance between a surface of the depressed portion of the film to be polished and a surface of the polishing cloth during polishing is set larger than an average diameter of the polishing grains.

According to the second aspect of the present invention, there is provided a polishing method comprising the steps of: forming a film to be polished, having a depressed portion and a protruding portion on a surface of a substrate; and polishing the film to be polished by relatively moving the substrate and a polishing table, while pressing the substrate having the film to be polished, onto a polishing cloth of the polishing table and supplying a polishing solution containing polishing grains, between the film to be polished and the polishing cloth; wherein a frictional coefficient between the film to be polished and the polishing solution during polishing is larger than a frictional coefficient between the polishing cloth and the polishing solution.

According to the third aspect of the present invention, there is provided a polishing method having the steps of: forming a film to be polished, having a depressed portion and a protruding portion on a surface of a substrate; and polishing the film to be polished by relatively moving the substrate and a polishing table, while pressing the substrate having the film to be polished, onto a polishing cloth of the polishing table and supplying a polishing solution containing polishing grains, between the film to be polished and the polishing cloth; wherein an organic compound having a molecular weight of 100 or more, and containing at least one hydrophilic group selected from the group consisting of $COOM_1$ (M represents an atom or a functional group which can form a salt when substituted with a hydrogen atom of a carboxyl group), $SO_3H$ (sulfo group) and $SO_3M_2$ ($M_2$ represents an atom or a functional group which can form a salt when substituted with a hydrogen atom of a carboxyl group) is added to the polishing solution.

According to the fourth aspect of the present invention, there is provided a polishing method comprising the steps of: forming a film to be polished, having a depressed portion and a protruding portion on a surface of a substrate; and polishing the film to be polished by relatively moving the substrate and a polishing table, while pressing the substrate having the film to be polished, onto a polishing cloth of the polishing table and supplying a polishing solution containing polishing grains, between the film to be polished and the polishing cloth; wherein a content of an organic compound in of the polishing solution supplied is varied during polishing.

Further, there are provided a polishing solution in which polishing grains are dispersed into a dispersion medium, and a polishing agent containing an organic compound having a molecular weight of 100 or more and containing at least one hydrophilic group selected from the group consisting of $COOM_1$ (M represents an atom or a functional group which can form a salt when substituted with a hydrogen atom of a carboxyl group), $SO_3H$ (sulfo group) and $SO_3M_2$ ($M_2$ represents an atom or a functional group which can form a salt when substituted with a hydrogen atom of a carboxyl group) added to the polishing solution.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 13 is a graph showing the relationship between the polishing rate and the content of a polycarboxylic ammonium salt in the polishing solution in the case where the diameter of polishing grains is varied;

FIG. 14 is a graph showing the relationship between the polishing rate and the content of a polycarboxylic ammonium salt in the polishing solution in the case where the polishing pressure is varied;

DETAILED DESCRIPTION OF THE PREFERRED EMBODIMENTS

Figure 1A:
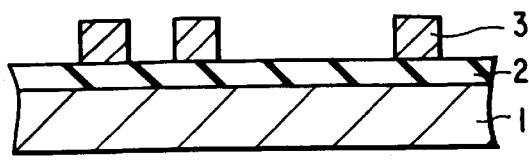
FIGS. 1A to 1E are cross sections of a film, illustrating a conventional polishing method.
Figure 1B:
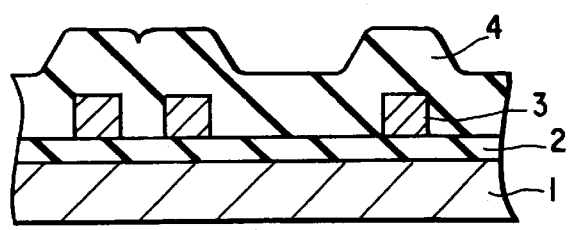
Figure 1C:
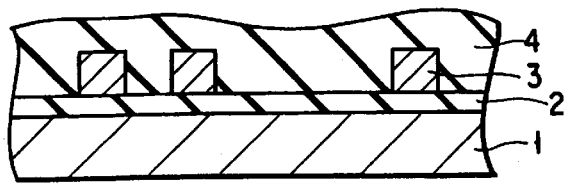
Figure 1D:
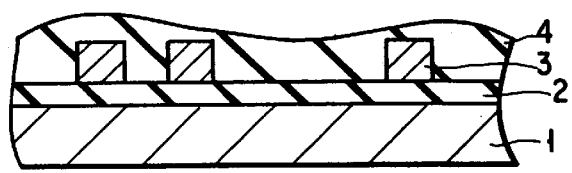
Figure 1E:
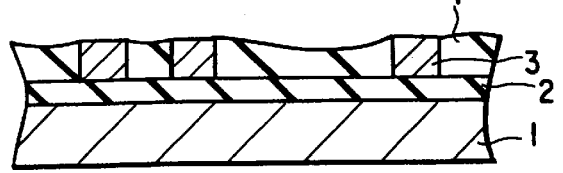
Figure 2:
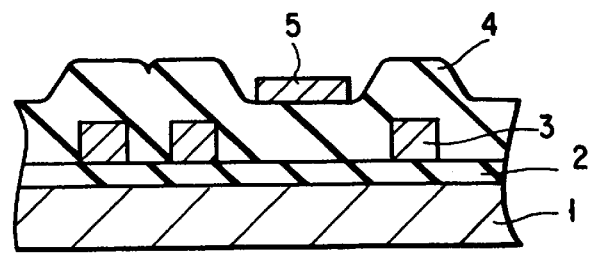
FIG. 2 is a cross section of another film, illustrating another conventional polishing method.

The inventors of the present invention has achieved the present invention based on the following discovery. That is, when an organic compound having a very strong interaction with a to-be-polished film is added, the average distance between the surface of a depressed portion of the to-be-polished film and the surface of the polishing cloth during a polishing process is rendered wider than the average diameter of polishing grains, or the friction coefficient between the to-be-polished film and the polishing solution during a polishing process is rendered larger than the friction coefficient between the polishing cloth and the polishing solution. Therefore, only the protruding portion of the to-be-polished film having an irregular surface, is polished with priority, and when the surface is flattened, the polishing rate is lowered.

In the polishing method of the present invention, an organic compound having a strong interaction with a film to be polished, for example, an organic compound containing a hydrophilic group such as a carboxyl group or a sulfo group and having a molecular weight of 100 or more, is added to a polishing solution, thus forming a stagnant? layer on the surface of the depressed portion of the to-be-polished film. Consequently, the average distance between the surface of the depressed portion of the film and the surface of the polishing cloth in a polishing process is rendered wider than the average diameter of the polishing grains.

In this polishing process, the number of polishing grains effectively contributing to the polishing of the depressed portion of the film is apparently reduced, and therefore the protruding portion of the film is polished with priority. Further, the polishing rate is lowered as the surface of the film is flattened. Consequently, the polishing can be stopped at the end point of polishing while preventing the occurrence of dishing. Therefore, the thickness of the polishing film can be controlled, and only the protruding portions can be removed so as to flatten the surface of the film.

In the polishing method of the present invention, the polishing can be controlled also by making the frictional coefficient between a film to be polished and a polishing solution in a polishing process, larger than the frictional force between a polishing cloth and the polishing solution.

Therefore, the surface of the film to be polished can be flattened at high accuracy.

Further, in the polishing method of the present invention, the organic compound having a strong interaction with the to-be-polished film is added and, the polishing rate can be varied during the polishing process, thus improving the controllability of the polishing. For example, with the addition of the organic compound to the polishing solution in the middle of the polishing process, the polishing rate can be increased until the middle of the polishing process, and the surface smoothing degree of the film to be polished can be improved at the final stage of the polishing process.

In the first to fourth aspects of the invention, silicon, quartz, sapphire, $Al_2O_3$, and a compound of an element of Group III and an element of Group V of the periodic table, are used as materials for each substrate. As a film to be polished, a film mainly containing $SiO_2$, α-Si, poly-Si, SiON, SiOF, BPSG (boro-phospho-silicate glass), PSG (phospho-silicate glass), SiN, $Si_3N_4$, Si, Al, W, Ag, Cu, Ti, TiN, Au, Pt or the like can be used.

As the polishing powder, the powder mainly containing $SiO_2$, $CeO_2$, $Al_2O_3$, $Fe_2O_3$, SiC, SiN, $ZrO_2$, $TiO_2$, C (diamond) or the like, can be used. A polishing solution can be prepared by dispersing the polishing powder into a dispersion medium such as pure water or alcohol. It is preferable that the average grain diameter of the polishing powder should be 0.01 to 5.0 μm. This is because, if the average grain diameter of the powder is less than 0.01 μm, the polishing rate is excessively lowered, whereas if it exceeds 5.0 μm, the surface of the film may be damaged.

A generally used polishing cloth can be used as the polishing cloth. The pressing force, the supplying amount and the relative rotation speed between the substrate and the polishing table, used for the polishing process can be set under general conditions.

In the first aspect, the fact that the average distance between the surface of the depressed portion of the to-be-polished film and the surface of the polishing cloth in the polishing process becomes larger than the average diameter of the polishing grains, means the state in which the polishing rate for polishing a depressed portion or a flat portion of the film is proportional to the content of an organic compound. More specifically, in FIG. 7, the crosspoint made by a tangent line extending from the side representing that polycarboxylic ammonium salt is not added and another line extending from the side where polycarboxylic ammonium salt is added in great amount, that is, the adding amount of polycarboxylic ammonium salt, falls within a range between 2.2 weight % and 4.5 weight %. The reason why the polishing rate only gradually changes is that the grain diameter is not unified.

In the second aspect, the fact that the frictional coefficient between the surface of the depressed is portion of the to-be-polished film and the polishing solution in the polishing process becomes larger than the frictional coefficient between the polishing cloth and the polishing solution, means the state in which the torque applied to the polishing table having the polishing cloth is rendered constant.

In the third aspect, the organic compound to be added to the polishing solution should preferably be a high-molecular polycarboxylic ammonium salt or a high-molecular ammonium polysulfonate. Examples of the hydrophilic group contained in these organic compound are —COOH (carboxyl group), —COOM (M: an atom or a functional group which can form a salt when substituted with the hydrogen atom of the carboxyl group, for example, —Na, —$NH_4$), —$SO_3H$ (sulfo group) and —COOM (M: an atom which can form a salt when substituted with the hydrogen atom of the sulfo group, for example, —Na, —$NH_4$). Of these hydrophilic groups, —COOM, —$SO_3H$ and —$SO_3M$ are preferable since they are easily dissolved to water. Further, the molecular weight of each organic compound should preferably be 100 or more. This is because, if the molecular weight of the organic compound is less than 100, a stagnant layer, which will be explained later, cannot be easily formed. A specific example of the organic compound to be added to the polishing solution is polycarboxylic ammonium salt, polysulfonic ammonium salt, or the like.

In the fourth aspect, as the method of adjusting the content of an organic compound in the polishing solution to be supplied, a technique in which two or more polishing solution supplying tanks containing polishing solutions having different content of the organic compounds and the supply of a solution from each tank is switched over, or a technique in which the supplying amount from each of the polishing solution supplying tank and the organic compound supplying tank is adjusted, can be used.

In the first to fourth aspects of the present invention, the load applied to the film to be polished, that is, a pressure for pressing the substrate on the polishing table (pressing force), the diameter of the polishing grains contained in the polishing solution, the content of the organic compound in the polishing solution in which polishing grains are dispersed and the rotation number of the substrate with respect to the polishing table are appropriately set, so as to satisfy the requirements of the first to fourth aspects. The rotation number of the substrate, in the case where a vacuum chuck holder or the like is used for supporting the substrate, can be adjusted by adjusting the rotation number of the holder.

Examples of the present invention will now be described with reference to accompanying drawings.

EXAMPLE 1

Figure 3A:
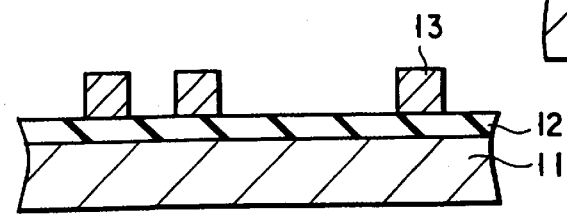
FIGS. 3A and 3B are cross sections of a film, illustrating a film to be polished by the polishing method of the present invention.
Figure 3B:
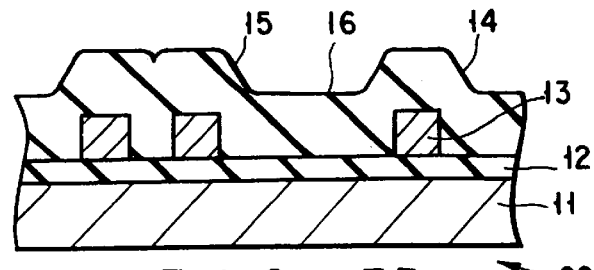

As shown in FIG. 3A, a silicon oxide film 12 was formed as an insulation film on a silicon substrate 11 a ratio of protruding portions of which was 50% of the entire surface of the substrate, and an aluminum wiring portion 13 having a width of 0.3 μm and a height of 0.4 μm was formed on the silicon oxide film 12 by a general photolithography method and a general etching method. Next, as shown in FIG. 3B, a silicon oxide film 14 having a thickness of 1.3 μm was formed by a plasma CVD method, thus forming a sample 20. In this figure, reference numeral 15 denotes a protruding portion and numeral 16 denotes a depressed portion.

Figure 4:
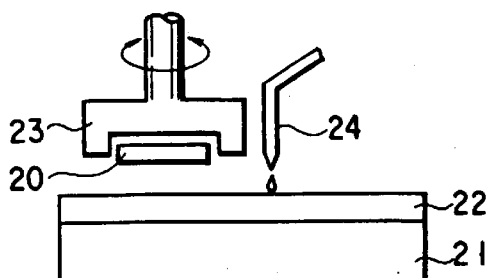
FIG. 4 is a diagram briefly showing a polishing device used in the polishing method of the present invention.

Next, the sample 20 was subjected to a CMP by use of a polishing apparatus shown in FIG. 4, thus smoothing the interlayer insulation film. The apparatus consists of a rotatable polishing table 21, a polishing cloth adhered onto the polishing table 21, a rotatable vacuum chuck holder 23 located above the polishing table 21 and a polishing solution supplying pipe 24 connected to a polishing solution tank and having an ejecting portion extending close to the cloth 22. The sample 20 was vacuum-chucked by the vacuum chuck holder 23 so that the surface to be polished faced the polishing cross 22. The polishing solution supplying pipe 24 includes means for controlling the supplying amount of the polishing solution. It should be noted that the polishing cloth 22 was a resin-impregnated unwoven cloth having a thickness of 1.2 mm and a hardness of 85.

In the CMP, as the polishing solution, there was used a type obtained by dispersing oxide cerium grains having an average diameter of 0.6 μm to pure water at a ratio of 1.0 weight %, adding 2.5 weight % of polycarboxylic ammonium salt thereto, and adjusting the viscosity of the solution to 3.0 cP while measuring it with an Ostwald's viscometer. The polishing conditions were set as follows. That is, the polishing pressure was set to 300 gf/cm$^2$ and the rotation number of the polishing table and the vacuum chuck holder was set to 100 rpm (these conditions were called as the standard conditions for polishing). It should be noted that the pressure of the sample 20 abutting to the polishing cloth 22 could be controlled arbitrarily by compressed air.

Figure 5A:
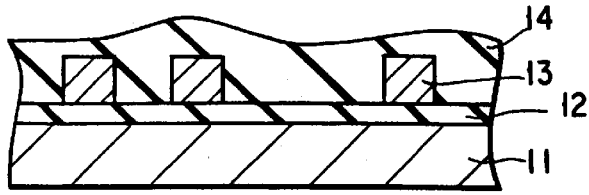
FIGS. 5A to 5C are cross sections showing a change in shape of a sample polished by the polishing method of the present invention.
Figure 5B:
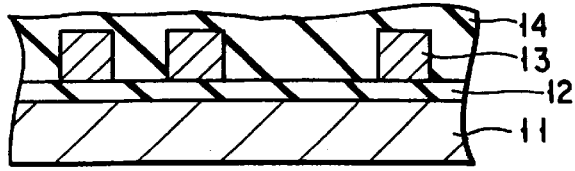
Figure 5C:
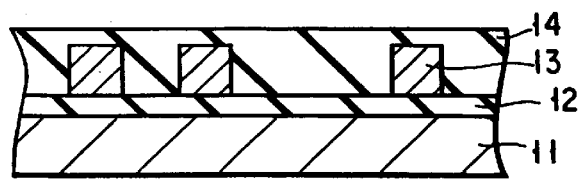

A change in the cross sectional shape along with an elapse of time in the case where the sample 20 was polished by the polishing method of the present invention illustrated in FIGS. 5A to 5C. FIG. 5A shows a cross sectional shape after 60 seconds of the polishing process, and FIG. 5B shows a cross sectional shape after 120 seconds of the polishing process. After the protruding portions were polished and a flat surface was obtained as shown in FIG. 5B, the polished did not substantially progress, thus always obtaining an ideal cross sectional shape as shown in FIG. 5C. As can be seen from FIG. 5C, the dishing can be significantly controlled.

Figure 6:
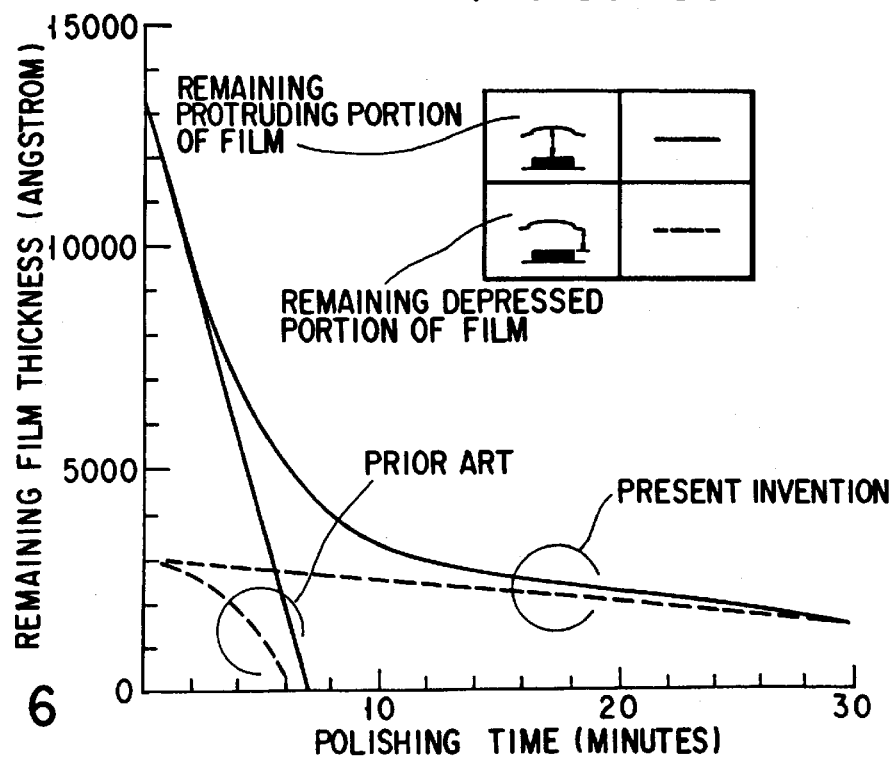
FIG. 6 is a graph illustrating a change in remaining thicknesses of a protruding portion and a depressed portion, created by polishing along with an elapse of time.

FIG. 6 shows a change in remaining thickness of the protruding portion and the depressed portion, along with an elapse of time. FIG. 6 also shows the result of a CMP carried out under the standard conditions by use of a polishing agent and prepared by dispersing oxide cerium grains having an average grain diameter of 0.6 μm into pure water at a ratio of 1.0 weight %. As can be seen from FIG. 6, in the polishing method of the present invention, when the difference in thickness between the protruding portion 15 and the depressed portion becomes small (circled portion in the figure), both the protruding portion 15 and the depressed portion 16 are not polished any further. Thus, the polishing process can be stopped at the point where an ideal remaining thickness is obtained, and the dishing can be prevented. It is considered that such an effect can be obtained for the following reason. That is, with the addition of polycarboxylic ammonium salt to the polishing solution, the average distance between the main surface of the silicon oxide film and the main surface of the polishing cross is rendered larger than the average diameter of the cerium oxide grains, or the frictional coefficient between the silicon oxide film and the polishing solution in the polishing process is rendered lower than the frictional coefficient between the polishing cloth and the solution. More specifically, when the average distance between the main surface of the silicon oxide film and the main surface of the polishing cloth is widened, the cerium oxide grains do not easily act on the surface of silicon oxide. Consequently, the polishing rate is gradually lowered in inversely proportional to the viscosity of the polishing liquid. When the distance is widened to have a certain width or more, the polishing rate is made constant. When the polishing is carried out in the above-described state, the cerium oxide grains act the protruding portion with priority. However, after the irregularity of the surface is reduced, the grains no longer act on the protruding portion, thus achieving a good controllability of the film thickness and suppressing the dishing.

In contrast, with the conventional polishing method, even after the difference in film thickness between the protruding portion 15 and the depressed portion 16 would be reduced, both the protruding portion 15 and the depressed portion 16 are polished.

Figure 7:
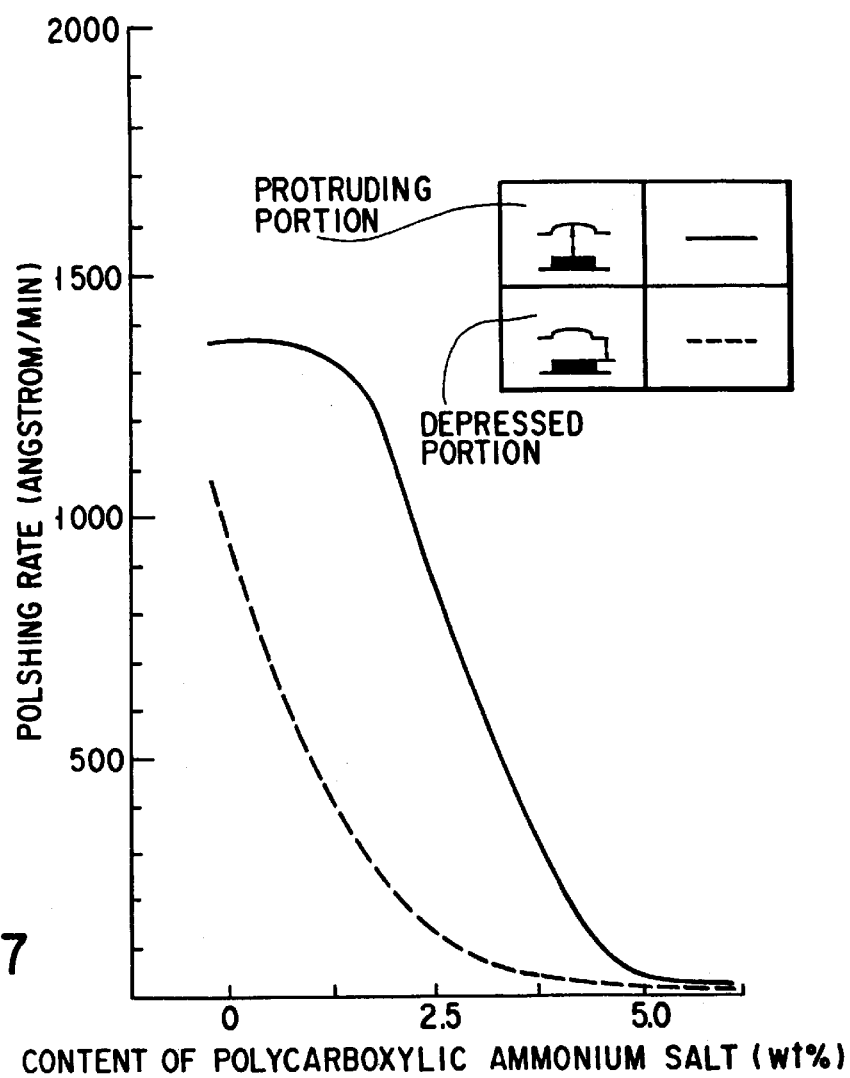
FIG. 7 is a graph showing the relationship between a polishing rate of each of the protruding and depressed portions, and the content of a polycarboxylic ammonium salt in the polishing solution.

Next, in order to examine the effect of polycarboxylic ammonium salt added to the polishing solution, the sample 20 shown in FIG. 3B is subjected to the CMP process under the standard conditions by use of a polishing solution, which was prepared by adjusting the amount of addition of polycarboxylic ammonium salt. The results of this examination are shown in FIGS. 7 and 8.

Figure 8:
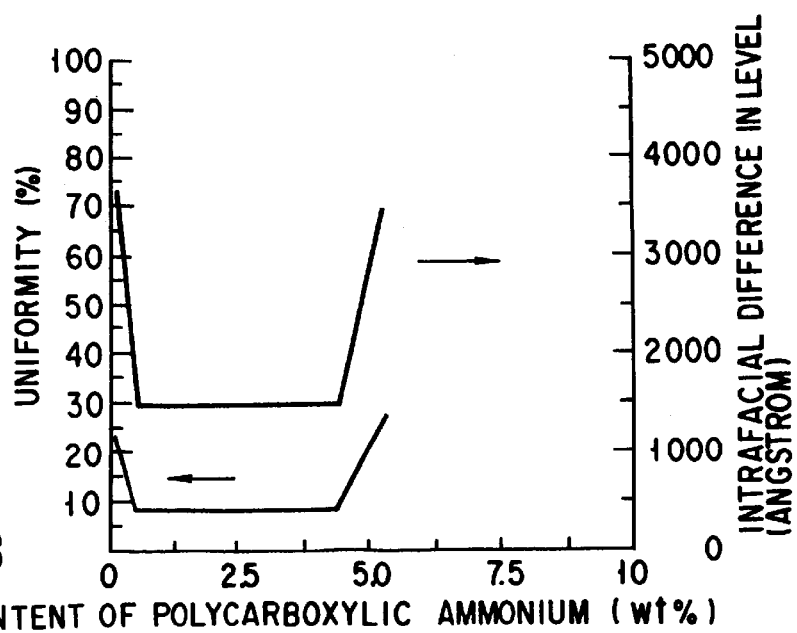
FIG. 8 is graph showing the relationship between an intrafacial uniformity and an intrafacial maximum step of the film after polishing, and the content of a polycarboxylic ammonium salt in the polishing solution.

FIG. 8 is a graph showing the relationship between the polishing rate of each of the protruding portion 15 and the depressed portion 16, and the content of a polycarboxylic ammonium salt in the polishing solution. As can be understood from FIG. 7, as the amount of addition of polycarboxylic ammonium salt is increased, the polishing rate is reduced. In specific, the polishing rate for the depressed portion 16 is made constant at a point of 2.2 weight % or higher, whereas the polishing rate for the protruding portion 15 is abruptly decreased at a point close to 1.0 weight %, and is made constant at a point of 5.0 weight % or higher.

FIG. 8 is a graph showing the relationships between the content of a polycarboxylic ammonium salt in the polishing solution, and both the intrafacial uniformity and the intrafacial irregularity of the film after the CMP process. As can be seen from FIG. 8, when the content is in a range of 0.4 to 4.5 weight %, an ideal cross sectional shape with a high intrafacial uniformity and a less intrafacial irregularity, can be obtained.

Therefore, as the polycarboxylic ammonium salt is added to the polishing solution, the selection ratio in which the protruding portion 15 and the depressed portion 16 are polished, is raised. Consequently, only the protruding portion 15 can be polished with priority, and the intrafacial uniformity is improved when the content is 0.4 to 4.5 weight %. Further, in a range of the content of 2.2 to 4.5 weight %, when the surface is smoothed, the polishing no longer proceeds. Thus, the polishing can be stopped at the final point of the polishing with a high controllability.

Figure 9:
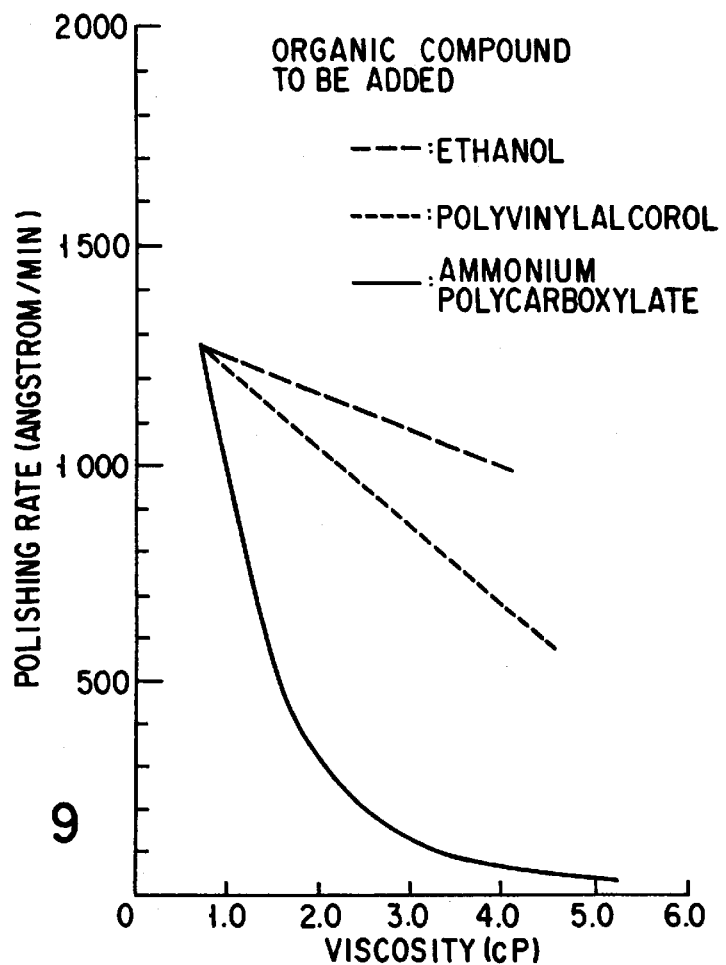
FIG. 9 is a graph showing the relationship between a polishing rate of a depressed portions, and the viscosity of a polishing solution.

Next, in order to examine, in more detail, the effect of polycarboxylic ammonium salt added to the polishing solution, the sample 20 shown in FIG. 3B is subjected to the CMP process under the standard conditions by use of polishing solutions each having a different viscosity which was prepared by adding polycarboxylic ammonium salt or ethanol or polyvinyl alcohol having a molecular weight of 20000 to 30000. The results of this examination are shown in FIG. 9. FIG. 9 is a graph showing the relationship between the polishing rate of the depressed portion 16, and the viscosity of the polishing solution. As can be understood from FIG. 9, in the case of a solution to which polycarboxylic ammonium salt is added, the proportion in decreasing of polishing rate is made constant at a point close to 2.0 cP. From the characteristics of the polishing solution to which polycarboxylic ammonium salt was added, show in FIG. 9, it can be concluded that only the protruding portion 15 was be polished with priority, and when the surface is smoothed, the polishing no longer proceeds. In the case where a polishing solution to which ethanol or polyvinylalcohol was added, was used, as the viscosity is increased, the polishing rate is reduced. However, the proportion in decreasing of polishing rate is not made constant.

Figure 10:
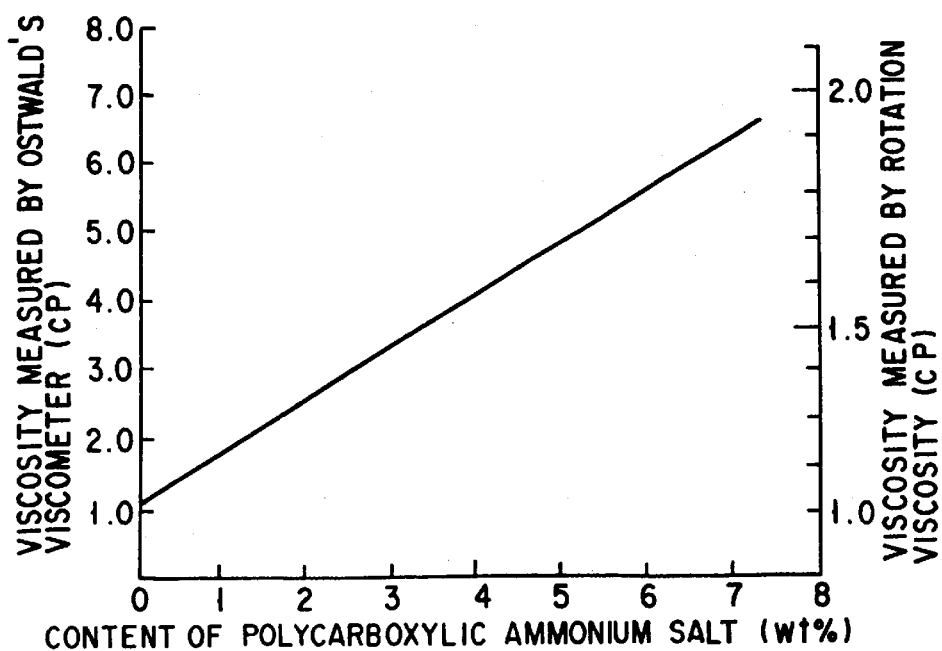
FIG. 10 is a graph showing the relationship between the addition of polycarboxylic ammonium salt and the viscosity of a polishing solution.

Next, the relationship between the addition of polycarboxylic ammonium salt and the viscosity of the polishing solution was examined by use of a rotation viscometer and an Ostwald's viscometer, and the results thereof are shown in FIG. 10. As can be understood from FIG. 10, as the amount of polycarboxylic ammonium salt is increased, the viscosity of the polishing solution is linearly increased. Therefore, it can be concluded that the polishing solution to which polycarboxylic ammonium salt was added, was a Newton viscous fluid. It should be noted that the value measured by the rotation viscometer was smaller than that of the Ostwald's viscometer. This is because the apparent viscosity is increased since the interaction between the polishing agent and glass is high.

Next, the operation of the polishing method of the present invention, which is assumed from the above results, will now be described.

Figure 11A:
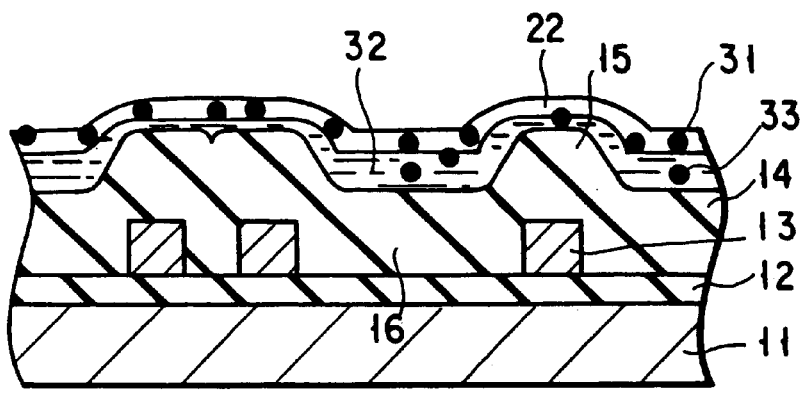
FIG. 11A is a diagram illustrating the mechanism of the polishing method of the present invention.

FIG. 11A is a cross sectional view illustrating the case where the sample 20 shown in FIG. 3B is subjected to an CMP process by the polishing method of the present invention. As can be understood from FIG. 11A, when the polishing solution to which a predetermined amount of polycarboxylic ammonium salt was added, is used in the CMO process, the distance between the main surface of the silicon oxide film 14 and the polishing cloth 22 is widened due to the viscosity of the polishing solution. At the same time, the protruding portion 15 is polished by the polishing grains 31. In the depressed portion 16, the distance between the main surface of the silicon oxide film 14 and the polishing cloth 22 becomes larger than the average grain diameter of the polishing grains 31, and a stagnant layer 33 made of polishing solution 32 containing polishing grains 31 is formed. Consequently, the apparent number of the polishing grains acting effectively in the polishing of the depressed portion 16 is reduced. Thus, the protruding portion 15 is polished with priority, and when the surface of the silicon oxide film 14 is flattened, the further polishing is not carried out.

Figure 11B:
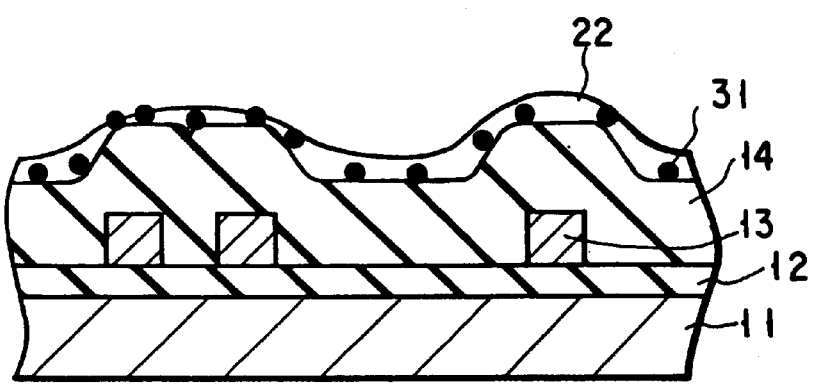
FIG. 11B is a diagram illustrating the conventional polishing method.

On the other hand, FIG. 11B is a cross section illustrating the case where the sample 20 shown in FIG. 3B was subjected to the CMP process by use of a polishing solution to which ethanol or polyvinylalcohol was added.

As can be understood from FIG. 11B, the distance between the main surface of the silicon oxide film 14 and the polishing cloth 22 is widened due to the viscosity of the polishing solution; however no stagnant layer is formed in the depressed portion 16. Therefore, the polishing grains 31 act equally on the protruding portion 15 and the depressed portion 16. For this reason, it becomes difficult to take a selection ratio between the depressed portion and the depressed portion 16. In this case, it is a possibility that the viscosity of the polishing solution is further increased in order to reduce the number of polishing grains acting on the depressed portion 16. However, such an idea is not preferable since an increase in viscosity also lowers the polishing rate of the protruding portion 15.

Figure 12:
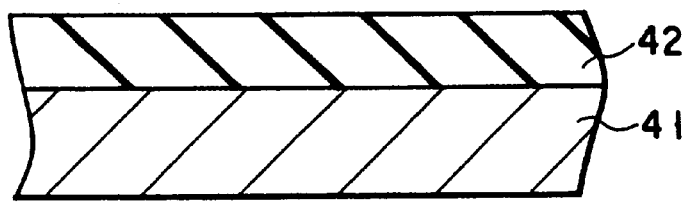
FIG. 12 is a diagram showing a film to be polished by the polishing method of the present invention.

Next, the phenomenon in which the polishing no longer proceeds after the surface is smoothed, will now be discussed in further detail. In connection with this phenomenon, a change in the viscosity of the polishing solution, which occurs when the grain diameter of polishing grains used or the polishing pressure are varied, was examined. A sample, which was prepared by forming a silicon oxide film 42 having a thickness of 1 $\mu$m on a silicon substrate 41 by a plasma CVD method, as shown in FIG. 12, that is, a type having a smooth surface, was used.

First, the relationship between the content of the polycarboxylic ammonium salt in the polishing solution and the polishing rate along with variable diameter of the polishing grains was examined, and the results thereof are shown in FIG. 13. The polishing solution, which was obtained by dispersing cerium oxide grains having an average grain diameter of 2.0 $\mu$m into pure water at a ratio of 1.0 weight %, was used. The polishing conditions were the same as the standard conditions, and the sample shown in FIG. 3B was used as the film to be polished. As can be seen in FIG. 13, the region on the graph, which indicates the phenomenon that the polishing did not substantially proceed after the surface was smoothed (to be called a specific region hereinafter) was shifted to the high content side as compared to the case where cerium oxide grains having an average diameter of 0.6 $\mu$m were used.

Next, the relationship between the content of the polycarboxylic ammonium salt in the polishing solution and the polishing rate along with a variable polishing pressure was examined, and the results thereof are shown in FIG. 14. The polishing solution, which was obtained by dispersing cerium oxide grains having an average grain diameter of 0.6 $\mu$m into pure water at a ratio of 1.0 weight %, was used. The polishing conditions were the same as the standard conditions, and the sample shown in FIG. 3B was used as the film to be polished. As can be seen in FIG. 14, the specific region was shifted to the high content side as the polishing pressure was increased.

From the above results, it can be concluded that the specific region varies depending on the diameter of the polishing grains and the polishing pressure.

The effect of the above-described example was obtained when the molecular weight of polycarboxylic ammonium salt was 100 or more, or more preferably, 500 or more. Further, when the molecular weight was 3000 or more, the effect was more significantly exhibited.

Further, the surfaces of flat silicon oxide films were analyzed by SIMS (secondary ion mass spectrometry). In the case of the conventional polishing method, about $10^{18}$ atoms/cm$^3$ of cesium was detected, whereas in the case of the present invention method, about $10^{16}$ atoms/cm$^3$ of cesium was detected. Therefore, it can be concluded that the polished surface can be cleaned, and the creation of particles, the lowering of the resistance in pressure, and the like can be prevented, with the polishing method of the present invention.

EXAMPLE 2

The case where the polishing method of the present invention was applied to formation of a buried metal wiring portion, will now be described.

Figure 15A:
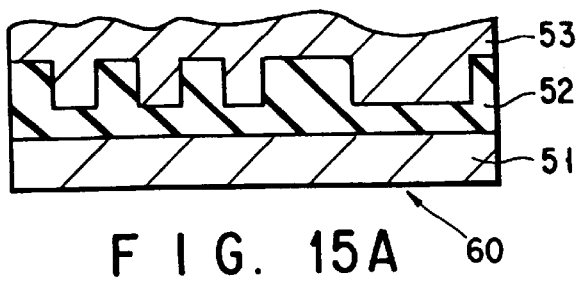
FIGS. 15A to 15D are cross sections of a film in the case where the polishing method of the present invention is applied to the formation of a buried metal wiring portion.

First, as shown in FIG. 15A, a silicon oxide film 52 was formed as an insulation film on a silicon substrate 51. Then, trenches for wiring, each having a width of 0.4 to 10 $\mu$m and a depth of 0.4 $\mu$m were formed in the surface of the silicon oxide 52, and a polycrystalline Al film 53 having a thickness of 0.6 $\mu$m was formed on the surface by a spattering method. After that, the resultant was subjected to a heat treatment, and the trenches were buried with Al, thus obtaining a sample 60.

Next, the sample 60 was subjected to CMP by use of the polishing apparatus shown in FIG. 4, thus forming a buried metal wiring portion. In the CMP, a polishing solution prepared by dispersing silica grains having an average grain diameter of 0.05 $\mu$m into pure water at a ratio of 10 weight %. The polishing conditions were the same as the standard conditions of Example 1.

Figure 15B:
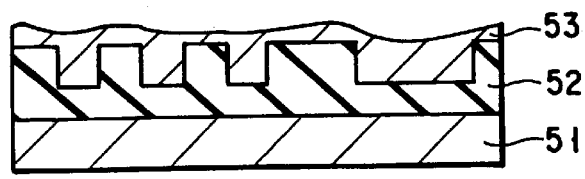
Figure 15C:
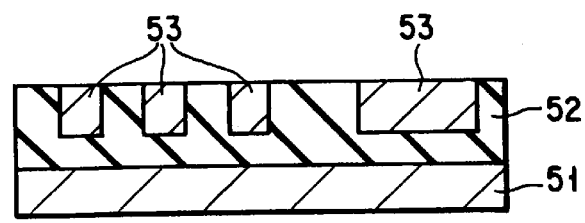
Figure 15D:
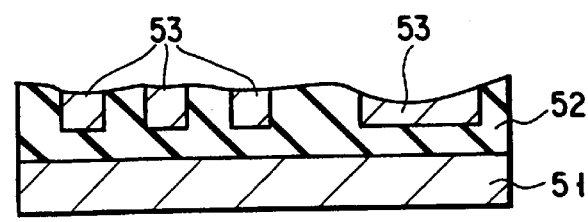

The polishing was carried out until the cross sectional shape shown in FIG. 15B was obtained. Then, the polishing was carried out again under the same conditions except that the viscosity of the polishing solution was adjusted to 4.0 cP by adding polycarboxylic ammonium salt thereto at a ratio of 4 weight %. With this polishing, a buried metal wiring portion having a smooth surface without dishing, as shown in FIG. 15C, was formed.

In the case where the conventional polishing method was used, the dishing of the Al film 52 occurred in a wide metal wiring portion as shown in FIG. 15F, even if the polishing was stopped at an ideal point. In contrast, with the polishing method of the present invention, the polishing rate was not reduced in a less stepped or wide metal wiring portion, and the dishing was remarkably suppressed.

More specifically, the dishing amount of the surface of the buried metal wiring layer polished was examined by a probing type level meter with regard to each of the conventional polishing method and the present invention method. In the case of the conventional polishing method, the dishing amount was 1000 to 1500 Å in wiring having a width of 10 µm, whereas in the case of the present invention method, the difference was about 500 Å.

EXAMPLE 3

The case where the polishing method of the present invention was applied to formation of a contact, will now be described.

First, as shown in FIG. 15A, a silicon oxide film 72 was formed as an insulation film on a silicon substrate 71. Then, trenches for wiring, each having a width of 0.4 µm and a depth of 0.4 µm were formed in the surface of the silicon oxide 72, and a tungsten film 53 having a thickness of 0.6 µm was formed on the surface by a CVD method, thus forming a sample 80.

Figure 16A:
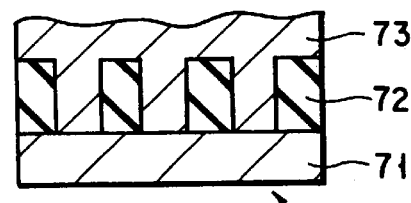
FIGS. 16A to 16D are cross sections of a film in the case where the polishing method of the present invention is applied to the formation of a contact portion.
Figure 16B:
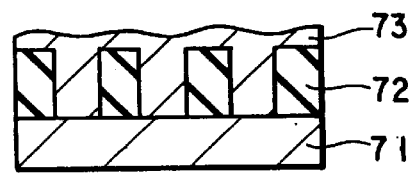
Figure 16C:
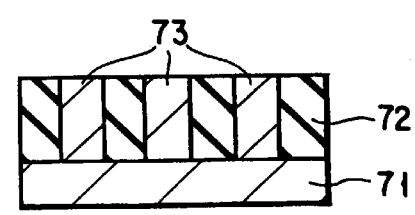

Next, the sample 80 was subjected to CMP by use of the polishing apparatus shown in FIG. 4, thus forming a contact. In the CMP, the polishing solution used here was prepared by dispersing alumina grains having an average grain diameter of 0.05 µm into pure water at a ratio of 10 weight %, so as to have a viscosity of 3.0 cP and pH of 5. The polishing conditions were the same as the standard conditions of Example 1. With this polishing, a contact having a smooth surface as shown in FIG. 16C was obtained without creating dishing, through the cross sectional shape shown in FIG. 16B, was formed.

Figure 16D:
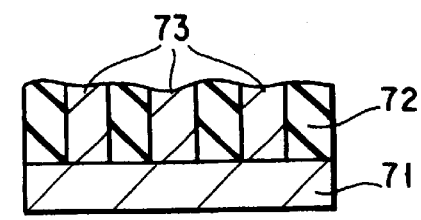

In the case where the conventional polishing method was used, the dishing of the tungsten film 73 occurred as shown in FIG. 16D, even if the polishing was stopped at an ideal point. In contrast, with the polishing method of the present invention, the polishing rate was not reduced in a less irregular film or a film having a large protruding portion, and the dishing was remarkably suppressed.

In this Example, a chemical effect takes place during the polishing of the tungsten film by adding ammonium polysulfonate to the polishing solution since pH thereof is 3.5. Therefore, scratches on the tungsten film can be erased. Further, in the polishing, a stagnant layer is formed on the silicon oxide film 72, scratches on the silicon oxide film 72 can be erased.

Figure 17:
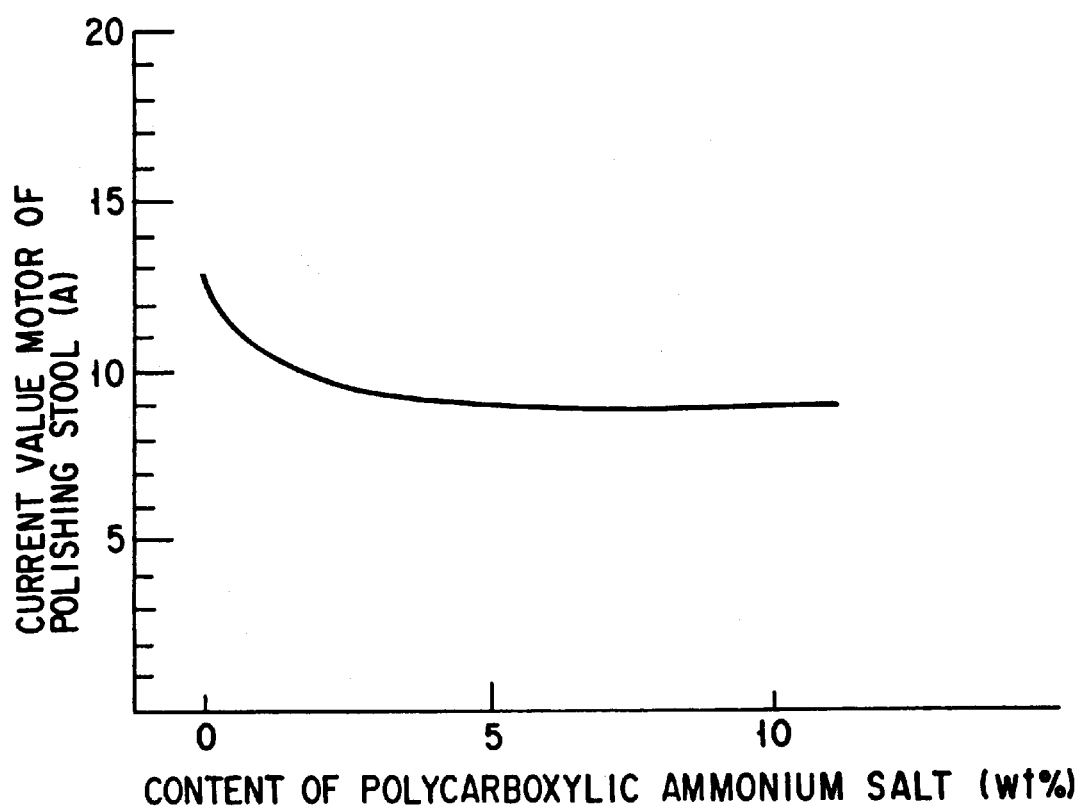
FIG. 17 is a graph indicating the motor current value of a polishing table with respect to a change in the content of a polycarboxylic ammonium salt in the polishing solution.

In the meantime, the motor current value of the polishing table with respect to a change in the viscosity of the polishing solution is illustrated in FIG. 17. As can be seen in FIG. 17, the motor current value was decreased as the viscosity of the polishing solution was increased. This phenomenon indicates that as the viscosity of the polishing solution increases, the frictional coefficient between the polishing cloth and a hard metal such as tungsten, decreases. Consequently, with the polishing method of the present invention, the deterioration of the polishing cloth in the polishing can be prevented.

The present invention is not limited to the above Examples 1 to 3, and can be remodeled into a variety of versions. For example, with use of $Fe_2O_3$ grains, SiC grains, SiN grains, $ZrO_2$ grains or $TiO_2$ grains as the polishing grains, an effect similar to the above can be obtained. Or, in order to increase the polishing rate, an alkali such KOH, NaOH or $NH_4OH$ or an acid such as HCl may be added and an effect similar to the above can be obtained. Further, if the temperature of the polishing solution is changed within a range of 0 to 90° C., an effect similar to the above can be obtained.

Further, the present invention is not limited to the above Examples in the following respect.

In the Examples 1 to 3, the descriptions were provided in connection with the cases where the polishing films are a silicon oxide film, an Al film and a tungsten film; however an effect similar to the above can be obtained in the case where the polishing film is an Ag film, Cu film, Si film or $Si_3N_4$ film.

The organic compound used in the polishing, having a strong interaction with the film to be polished, is not limited to those used in the above Examples, and as long as it can serve as a surfactant between the film and the polishing solution, any type may be used.

The average distance between the surface of the protruding portion of the film and the surface of the polishing cloth should preferably be the same as or less than the average diameter of the polishing grains, in terms of the polishing rate, the polishing selection ratio and the like. The content of a polycarboxylic ammonium salt should be 4.5 weight % or less, for example.

The present invention can be applied to the formation of an absorption pattern (W, Cr, etc.) of a mask for exposure, such as a phase shift mask or an X-ray mask. Or, as long as the essence of the invention remains, the invention can be practiced in various different versions.

An example of the method used in the present invention, for measuring the average distance between the surface of the depressed portion of the film and the surface of the polishing cloth, is a method of measuring a light of a chuck holder by using a laser displacement meter. An example of the method used in the present invention, for measuring a frictional coefficient between the film and the polishing solution and that between the polishing cloth and the polishing solution is a method of measuring a motor current of a polishing table .

As described above, in the polishing method of the present invention, an organic compound having at least one hydrophilic group and a molecular weight of 100 or more is added to the polishing solution, and therefore the average distance between the main surface of the film and the main surface of the polishing cloth is set wider than the average diameter of the polishing grains, or the frictional coefficient between the film and the polishing solution is set lower than that between the polishing cloth and the polishing solution. Therefore, only a predetermined protruding portion can be polished at high efficiency without causing dishing.

Additional advantages and modifications will readily occur to those skilled in the art. Therefore, the invention in its broader aspects is not limited to the specific details, representative agents, and illustrated examples shown and described herein. Accordingly, various modifications may be made without departing from the spirit or scope of the general inventive concept as defined by the appended claims and their equivalents.

What is claimed is:

1. A polishing method comprising:
    applying a polishing agent containing polishing grains and a surfactant onto an oxide film, which is formed on a substrate having a depressed portion and a protruding portion, said polishing grains containing $CeO_2$ as a main component, wherein the surfactant is an organic compound including at least one hydrophilic group selected from the group consisting of COOH, COOM$_1$, wherein M$_1$ represents an atom or a functional group which can form a salt when substituted for a hydrogen atom of a carboxyl group, SO$_3$H and SO$_3$M$_2$, wherein M$_2$ represents an atom or a functional group which can form a salt when substituted for a hydrogen atom of a sulfo group; and polishing the film until the film is flattened without the occurrence of dishing.

2. A polishing method comprising:

applying a polishing agent containing polishing grains and a surfactant onto an oxide film, which is formed on a substrate having a depressed portion and a protruding portion, wherein the surfactant is an organic compound including at least one hydrophilic group selected from the group consisting of COOH and COOM$_1$, wherein M$_1$ represents an atom or a functional group which can form a salt when substituted for a hydrogen atom of a carboxyl group, and polishing the film until the film is flattened without the occurrence of dishing.

3. A polishing method comprising:

applying a polishing agent containing polishing grains and a surfactant onto a metal film, which is formed on a substrate having a depressed portion and a protruding portion, wherein the surfactant is an organic compound including at least one hydrophilic group selected from the group consisting of SO$_3$H and SO$_3$M$_2$, wherein M$_2$ represents an atom or a functional group which can form a salt when substituted for a hydrogen atom of a sulfo group; and polishing the film until the film is flattened without the occurrence of dishing.

* * * * *